United States Patent
Driessen et al.

(10) Patent No.: US 7,084,953 B2
(45) Date of Patent: *Aug. 1, 2006

(54) LITHOGRAPHIC APPARATUS, DEVICE MANUFACTURING METHOD AND DEVICE MANUFACTURED THEREBY

(75) Inventors: Johannes Cornelis Driessen, Eindhoven (NL); Hermanus Mathias Joannes Rene Soemers, Mierlo (NL); Michael Jozefa Mathijs Renkens, Sittard (NL); Theodorus Hubertus Josephus Bisschops, Eindhoven (NL); Johannes Petrus Martinus Bernardus Vermeulen, Valkenswaard (NL); Antonius Maria Rijken, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/825,153

(22) Filed: Apr. 16, 2004

(65) Prior Publication Data

US 2004/0195527 A1    Oct. 7, 2004

Related U.S. Application Data

(63) Continuation of application No. 09/989,700, filed on Nov. 21, 2001, now Pat. No. 6,740,891.

(30) Foreign Application Priority Data

Nov. 30, 2000    (EP) .................................. 00310637

(51) Int. Cl.
G03B 27/52    (2006.01)

(52) U.S. Cl. ......................................... 355/30; 355/53

(58) Field of Classification Search ............. 250/492.1, 250/492.2, 492.21, 492.22, 492.3, 440.11, 250/441.11, 442.11; 355/53, 72, 76, 30
See application file for complete search history.

(56) References Cited

U.S. PATENT DOCUMENTS

| | | | |
|---|---|---|---|
| 3,125,492 A | 3/1964 | Baker | |
| 4,654,571 A | 3/1987 | Hinds | |
| 4,993,696 A | 2/1991 | Furukawa et al. | |
| 5,234,303 A | 8/1993 | Koyano | |
| 5,247,424 A | 9/1993 | Harris et al. | |
| 5,298,939 A | 3/1994 | Swanson et al. | |
| 5,380,246 A | 1/1995 | Katahira | |
| 5,811,803 A | 9/1998 | Komatsu et al. | |
| 5,914,493 A * | 6/1999 | Morita et al. ............ | 250/492.2 |
| 6,190,104 B1 | 2/2001 | Ikeda et al. | |
| 6,333,775 B1 | 12/2001 | Haney et al. | |
| 6,445,440 B1 * | 9/2002 | Bisschops et al. ............ | 355/53 |
| 6,451,507 B1 | 9/2002 | Suenaga et al. | |
| 6,459,472 B1 | 10/2002 | DeJager et al. | |
| 6,465,729 B1 | 10/2002 | Granoff et al. | |
| 6,603,130 B1 * | 8/2003 | Bisschops et al. ........ | 250/492.1 |

FOREIGN PATENT DOCUMENTS

| | | |
|---|---|---|
| EP | 1 018 669 A2 | 7/2000 |
| EP | 1 052 549 A2 | 11/2000 |
| EP | 1 052 550 A2 | 11/2000 |

(Continued)

*Primary Examiner*—Kiet T. Nguyen
(74) *Attorney, Agent, or Firm*—Pillsbury Winthrop Shaw Pittman LLP

(57) ABSTRACT

A lithographic projection apparatus includes conduits which supply utilities to components in a vacuum chamber such as object tables and/or associated motors and/or sensors. The conduits are shielded from exposure to the vacuum by conduit conducts having at least the same number of degrees of freedom as their associated object table.

19 Claims, 15 Drawing Sheets

FOREIGN PATENT DOCUMENTS

| | | |
|---|---|---|
| EP | 1 052 551 A2 | 11/2000 |
| EP | 1 052 553 A2 | 11/2000 |
| JP | 58044719 | 3/1983 |
| JP | 7201694 | 8/1995 |
| JP | 2001085291 | 3/2001 |

* cited by examiner

LITHOGRAPHIC APPARATUS, DEVICE MANUFACTURING METHOD AND DEVICE MANUFACTURED THEREBY

CROSS-REFERENCE TO RELATED APPLICATIONS

This is a continuation application of U.S. application Ser. No. 09/989,700, filed Nov. 21, 2001 now U.S. Pat. No. 6,740,891, which in turn claims priority from European Patent Application No. 00310637.4, filed Nov. 30, 2000, both of which are herein incorporated by reference in their entireties.

BACKGROUND OF THE INVENTION

1. Field of the Invention

The present invention relates to lithographic projection apparatus, and more particularly to apparatus including conduits for providing utilities such as power, water, control signals and gases through cables, hoses or pipes to a movable component in a vacuum chamber.

2. Background of the Related Art

A lithographic projection apparatus in accordance with the present invention generally includes a radiation system for providing a projection beam of radiation, a first object table for supporting patterning structure, the patterning structure serving to pattern the projection beam according to a desired pattern, a second object table for holding a substrate, a vacuum chamber provided with a first gas evacuating means for generating a vacuum beam path for the projection beam, a projection system for projecting the patterned beam onto a target portion of the substrate and conduits for providing utilities to a component moveable in at least one degree of freedom in said vacuum chamber.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the first object table will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from United States patents U.S. Pat. No. 5,296,891 and U.S. Pat. No. 5,523,193, which are incorporated herein by reference. In the case of a programmable mirror array, the first object table may be embodied as a frame or table, for example, which may be fixed or movable as required.

A programmable LCD array. An example of such a construction is given in U.S. Pat. No. 5,229,872, which is incorporated herein by reference. As above, the first object table in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus, the size of features that can be imaged onto the substrate is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser produced plasma sources, discharge plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. Further information with regard to the use of electron beams in lithography can be gleaned, for example, from U.S. Pat. No. 5,079,122 and U.S. Pat. No. 5,260,151, as well as from EP-A-0 965 888. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Otherwise, for apparatus using EUV radiation, the total vacuum pressure need only be between $10^{-3}$ and $10^{-5}$ millibar. Optical elements for EUV radiation can be spoiled, by the deposition of carbon layers on their surface, which imposes the additional requirement that hydrocarbon partial pressures should generally be kept as low as possible, for example below $10^{-8}$ or $10^{-9}$ millibar.

Working in a high vacuum imposes quite onerous conditions on the components that must be put into the vacuum. For components inside the vacuum chamber, materials that minimize or eliminate contaminant and total outgassing, i.e. both outgassing from the materials themselves and from gases adsorbed on their surfaces, should be used. It has been found that for the desired degree of movement required by the object holders, conduits can be made of plastics materials such that they are flexible enough. These types of materials often are deleterious to the vacuum in the vacuum chamber because outgassing of contaminants as described above will occur. There are plastics better suited for vacuum applications (for example teflon) but the large number of cables and lines which are required to be lead through the vacuum present a large surface area to outgassing of contaminants. It will be difficult to get a partially hydrocarbon pressure below $10^{-8}$ or $10^{-9}$ millibar, for example, when plastic conduits are used. Furthermore, the risk of leaks from conduits makes their use impractical. It would be very desirable to be able to reduce the use of conduits. However, conventional designs of substrate, mask and transfer stages are very complicated and employ large numbers of sensors and drive arrangements, which all need a large numbers of conduits for conveying water and gases and for protecting electric wiring.

To circumvent this problem it has been proposed in U.S. Pat. No. 4,993,696 to use metal pipes made of stainless material for the supply and exhaustion of an operating fluid or gas in a vacuum ambience. Two adjacent pipes may then be coupled with each other by a joint, which is arranged to allow swingable movement of one of the pipes relative to the other. The metal pipes will not suffer from outgassing as the nylon conduits will do. A disadvantage of the joints is that it is very difficult to design joints that are totally closed for fluids or gases in a vacuum environment. Therefore, there may be leakage of gases through the joint to the vacuum environment that will contaminate the vacuum environment.

Another solution has been proposed by European Patent Application 1052549. In this publication conduits are fed through hollow pipes that are rigidly connected to a movable object table and which pipes are used to transfer movements from outside a vacuum chamber to said table. The pipes are hollow and the pressure within the pipes is equal to the pressure outside the vacuum chamber. Between the wall of the vacuum chamber and the pipes differentially pumped seals are used to prevent the leakage of air to the vacuum chamber and at the same time allowing for movement of the object table.

SUMMARY OF THE INVENTION

One aspect of the present invention provides a lithographic apparatus with substantially reduced problems due to out-gassing of materials in the vacuum chamber.

According to the present invention there is provided a lithographic projection apparatus comprising:

a radiation system for providing a projection beam of radiation;

a first object table for supporting patterning structure, the patterning structure serving to pattern the projection beam according to a desired pattern;

a second object table for holding a substrate;

a vacuum chamber provided with a first gas evacuating means for generating a vacuum beam path for the projection beam;

a projection system for projecting the patterned beam onto a target portion of the substrate; and conduits for providing utilities to a component moveable in at least one degree of freedom in said vacuum chamber, characterized in that the apparatus further comprises:

a conduit shield for shielding the vacuum of said vacuum chamber from a space comprising the conduits, said conduct shield being constructed and arranged to allow for movement of the component in said at least one degree of freedom, and a second gas evacuating means for providing a vacuum in the space comprising the conduits.

The term utilities as here employed refers to the water, gas, electricity and signals that must be provided to the moveable component. The term conduit refers to the cables and tubes that are used to transport the utilities to the moveable component. More specifically the term conduits refers to such items as power cords, signal carriers, gas tubes (e.g. for supplying gas to a gas bearing in the table), coolant tubes, etc. Moveable components inside the vacuum chamber including the mask table and/or the substrate table and/or associated motors and/or sensors may be connected to a frame outside the vacuum chamber in this manner (using a distinct conduit conduct for each component).

It will be difficult to make the conduit shield airtight and at the same time flexible enough to allow for movement of the component. The inventors have solved this problem by the use of a conduit shield that will shield the vacuum chamber from the space comprising the conduits but need not to be completely airtight. The leakage through the not completely airtight conduit shield will be minimized by having a small or even no pressure difference between the vacuum in the vacuum chamber and the space comprising the conduits. The conduits will be in a space that is made vacuum by a second gas evacuating means and that will become dirty due to outgassing of the conduits. The dirty vacuum in the space comprising the conduits will not negatively effect the vacuum in the vacuum chamber because the use of the almost airtight conduit shield and the little pressure difference that exists between the space comprising the conduits and the vacuum chamber. The outflow of contaminants through the not completely airtight conduit shield to the vacuum chamber will thereby be minimized. At the same time the loosened requirements for the airtightness of the conduit shield will make it more easy to construct a conduit shield that allows for movement of the movable component. An other advantage of the construction according to the invention is that the force exerted on the conduit shield by any gas pressure in the space comprising the conduits is decreased by the second gas evacuating means so that lighter building materials can be used.

The vacuum in the vacuum chamber may have a hydrocarbon partial pressures below $10^{-8}$ or $10^{-9}$ millibar, for example, while that partial pressure in the space comprising the conduits will be substantial higher. The vacuum provided to the space comprising the conduits may be around $10^{-3}$ millibar and the vacuum provided to the vacuum chamber may be around $10^{-5}$ millibar or lower in the presence of the optical components.

According to a second aspect of the present invention there is provided a device manufacturing method comprising the steps of:

providing a substrate that is at least partially covered by a layer of radiation-sensitive material;

providing a vacuum to a first vacuum chamber;

providing utilities through conduits to at least one component moveable in at least a first direction in said first vacuum chamber;

projecting a projection beam of radiation using a radiation system through said vacuum chamber;

using patterning structure to endow the projection beam with a pattern in its cross-section;

projecting the patterned projection beam of radiation onto a target portion of the layer of radiation-sensitive material, characterized in that the method comprises the steps of:

shielding said vacuum in said vacuum chamber with a conduit shield from said conduits, moving said conduit shield so as to follow the moveable component; and providing a second vacuum in a space comprising the conduits and separated by the conduit shield from said vacuum chamber.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION OF EMBODIMENTS OF THE INVENTION

Embodiment 1

Figure 1:
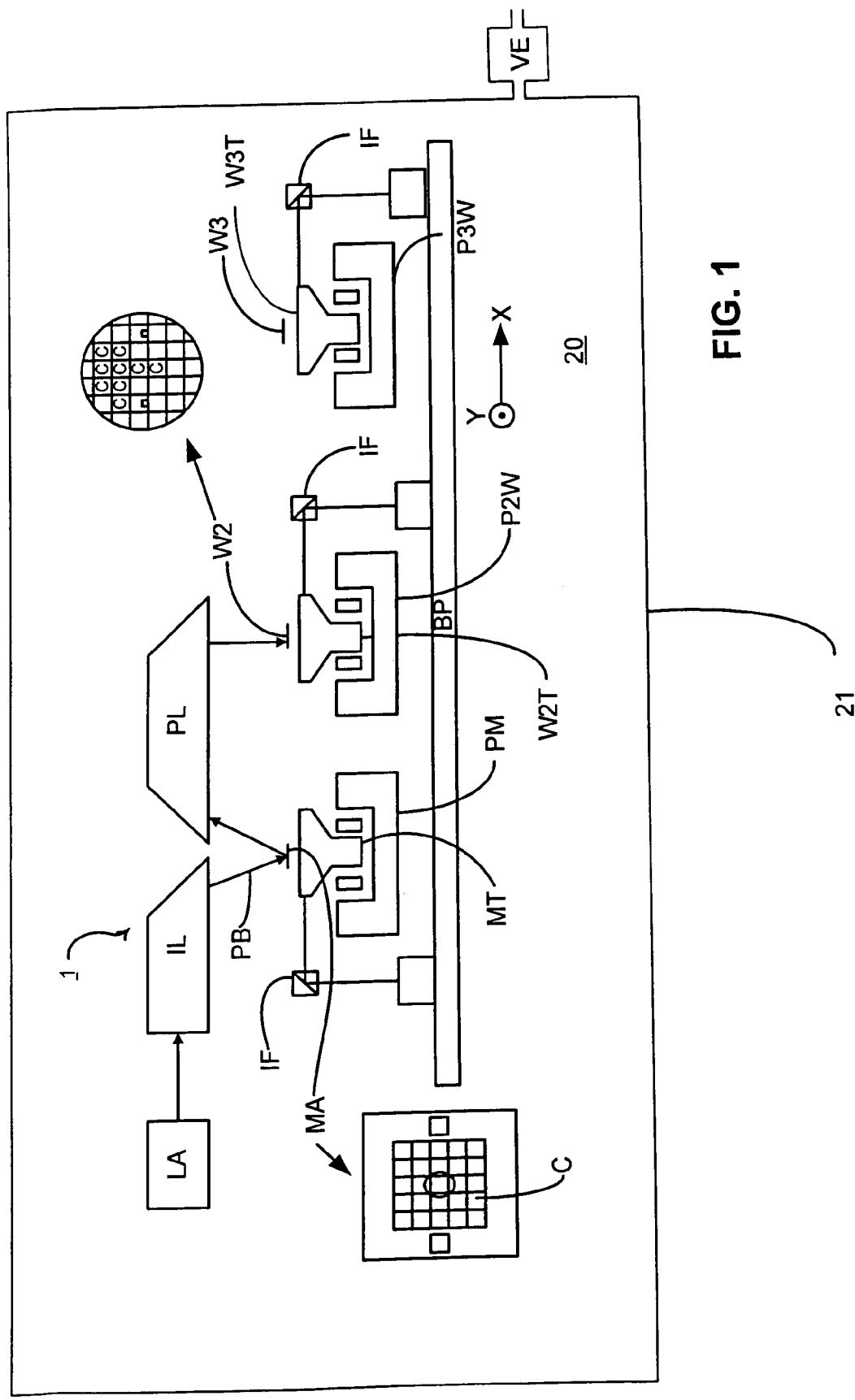
FIG. 1 depicts a lithographic projection apparatus according to a first embodiment of the invention.

FIG. 1 schematically depicts a lithographic projection apparatus 1 according to the invention. The apparatus comprises:
- a radiation system LA, IL for supplying a projection beam PB of radiation (e.g. UV or EUV radiation, electrons or ions);
- a first object table (mask table) MT provided with a first object (mask) holder for holding a mask MA (e.g. a reticle), and connected to first positioning means PM for accurately positioning the mask with respect to item PL;
- a second object table (substrate table) W2T provided with a second object (substrate) holder for holding a substrate W2 (e.g. a resist-coated silicon wafer), and connected to second positioning means P2W for accurately positioning the substrate with respect to item PL;
- a third object table (substrate table) W3T provided with a third object (substrate) holder for holding a substrate W3 (e.g. a resist-coated silicon wafer), and connected to third positioning means P3W for accurately positioning the substrate with respect to item PL; and
- a projection system ("lens") PL (e.g. a refractive or catadioptric system, a mirror group or an array of field deflectors) for imaging an irradiated portion of the mask MA onto a target portion C of the substrate W2, W3.

The radiation system comprises a source LA which produces a beam of radiation (e.g. an undulator or wiggler provided around the path of an electron beam in a storage ring or synchrotron, a plasma source, an electron or ion beam source, a mercury lamp or a laser). This beam is caused to traverse various optical components included in illumination system IL so that the resultant beam PB has a desired shape and intensity distribution in its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target portion C of the substrate W2, W3. With the aid of the positioning means P2W, P3W and interferometric displacement measuring means IF, the substrate table W2T, W3T can be moved accurately, e.g. so as to position different target portions C in the path of the beam PB. Similarly, the positioning means PM and interferometric displacement measuring means IF can be used to accurately position the mask MA with respect to the path of the beam PB, e.g. after mechanical retrieval of the mask MA from a mask library or during a scanning motion. In the prior art, movement of the object tables MT, W2T is generally realized with the aid of a long-stroke module (course positioning) and a short-stroke module (fine positioning), which are not explicitly depicted in FIG. 1.

The depicted apparatus can be used in two different modes:

In step mode, the mask table MT is kept essentially stationary, and an entire mask image is projected at once (i.e. a single "flash") onto a target portion C. The substrate table W2T, is then shifted in the X and/or Y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table W2T, is simultaneously moved in the same or opposite direction at a speed V=Mv, in which M is the magnification of the lens PL (e.g., M=¼ or ⅕). In this manner, a relatively large target portion C can be exposed, without having to compromise on resolution.

In a lithographic projection apparatus according to the present invention, at least one of first and second object tables are provided in a vacuum chamber 20. The vacuum inside the vacuum chamber 20 is created with the vacuum evacuating means VE, for example a pump.

Much equipment is associated with an object table, such as alignment sensors, air bearings with differential vacuum seals, positioning motors and actuators which require utilities such as power, control signals, vacuum and gasses and supply utilities such as measurement signals and further control signals. These utilities are supplied by conduits such as, for example, hoses, pipes, electrical cables etc. Although the conduit shield of the present invention is described in relation to an embodiment with two object tables, it is equally applicable to a lithographic projection apparatus with only a single object table or to other moveable components in the vacuum chamber.

Contamination control is a major issue. A small number of hydrocarbon $(C_xH_y)$ mono-layers on the mirrors, for instance, will lead to an unallowable reduction in the reflection efficiency of these mirrors. In a "clean" vacuum environment, materials like plastics and elastomers continuously outgas and hollow sections of constructions like screw joints tend to increase gas load (mainly water and hydrocarbons) and contamination via virtual leakage.

By shielding the conduits providing utilities to the object tables using conduit shields, which each have at least the same number of degrees of freedom as their associated object tables, it is possible for the conduits to be in a dirty vacuum along substantially their whole length. This helps to meet the vacuum requirements by reducing the amount of hydrocarbons exposed in the vacuum chamber 20 and also helps reducing the risks in case of the rupture of a coolant line. The number of joints (both rotational and translational) and arm portions can be varied depending on the required number of degrees of freedom of movement of the respective moveable component. For example the conduit shield in the form of a conduit conduct may only be required to have one arm which is not necessarily rotatable about a joint.

Figure 2:
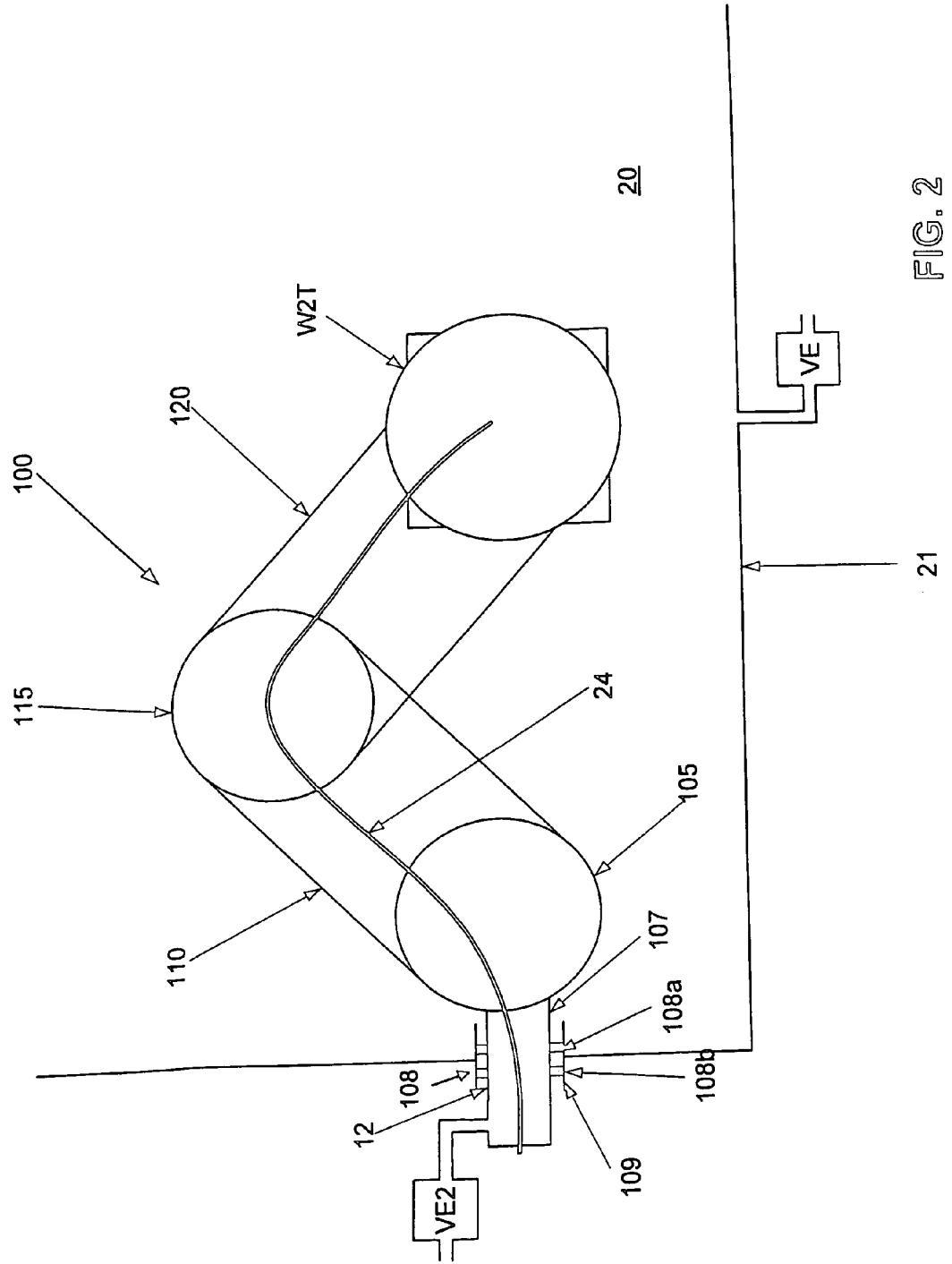
FIG. 2 is a schematic plan view showing a conduit conduct according to the first embodiment.

FIG. 2 shows only one conduit conduct 100 connecting conduits 24 from outside of the vacuum chamber 20 to the object table W2T. The first embodiment of the present invention has two such object tables. The conduits 24 pass through a side wall 21 of the vacuum chamber 20 at an input 12 to the conduit conduct 100 which comprises three hollow and elongate arm portions 107, 110, 120. Translation arm portion 107 is translatable relative to the vacuum chamber side wall 21. This is accomplished by arranging the outer surface of translating arm portion 107 to be in sliding contact with the inside surface of a receiving translation arm portion 109. A vacuum seal 108 may be provided to minimize the outflow of gases from the space comprising the conduits 24 to the vacuum chamber 20.

First arm portion 110 is joined at one end to translating arm portion 107 via second joint 105 and is rotatable about second joint 105. At the other end, first arm portion 110 is rotatably joined to an end of second arm portion 120 via first joint 115. The object table W2T is joined to second arm portion 120 at the other end. The joints 105, 115 and arm portions 107, 110, 120 are substantially airtight and therefore in this way the conduits 24 are provided to the object table W2T without being exposed to the vacuum in the vacuum chamber 20 and, if required, may be provided under manufacturer chosen conditions. If translation joints are used, it may be useful to provide a rough vacuum in the conduit conduct 100 such that the forces necessary to activate the joint are not excessively large (if the conduit is under atmospheric pressure, the vacuum in the vacuum chamber generates a force which acts to extend the translation joint). A rough vacuum is also useful in certain circumstances because the air tightness requirements for the joints are in that case loosened and deformation of the conduit conduct 100 is less likely to occur. This deformation may be detrimental to the working of the vacuum seals. To create the rough vacuum a second vacuum evacuating means VE2 may be provided to pump the air out of the conduit conduct 100.

The conduit conducts 100 may comprise torque motors in the joints 105, 115 such that the conduit conduct 100 can position the object table W2T. It is also possible that the conduit conduct 100 moves under the influence of the positioning means of the object table W2T. That is the conduit conducts 100 can be passive in that it does not comprise any driving motors and only moves under the influence of the object table W2T. If the conduit conduct is passive it might be advantageously to make a prediction of the force exerted by the conduit conduct 100 on the object table W2T so that feed forward can be compensated by the positioning means for the influence of the mass of the conduit conduct 100 on the movements of the object table W2T. This can be done either by calibration of the force influence or by making an algorithm calculating this force influence. Alternatively, force sensors can be used between the object table W2T and the conduit conduct that measure the force exerted by the object table W2T on the conduit conduct 100 and feed back compensate that force by adjusting the force exerted by the positioning means. Further information with regard to such a feed back system can be gleaned from European Patent Application EP 1 018 669 incorporated herein by reference. In some embodiments the conduit conducts 100 themselves can be used to position the object table W2T. It is possible to provide sensors in the joints for measuring the position of the object table W2T. The measurement thus obtained can be used for commutation purpose of the positioning means of the object table W2T. The positioning means may be a planar motor as described in WO 01/18944 incorporated herein by reference.

Alternatively, a differential vacuum seal at 108a and air, or gas, bearing at 108b can be provided between surface 107, 109 to allow for low friction movement between the arm portions 107, 109 while still maintaining the vacuum in the vacuum chamber 20. A differential vacuum seal and air, or gas, bearing assembly 108a, 108b is described in detail in the seventh embodiment.

It is advantageous in a lithographic apparatus to have two object tables for holding substrates which can be driven independently. In this way it is possible to be measuring or performing some other function such as unloading a previously exposed wafer and loading a new wafer in a measuring area at the same time as exposing a different, previously unexposed wafer, in the exposure area. The exchange of wafer tables between the measuring and exposure areas is called "swap". In the first embodiment, a third object table, designated W3T in FIG. 1 as well as a second object table W2T is provided for this purpose.

It is advantageous to reduce the size of the apparatus. The first embodiment achieves this through the arrangement of the first and second conduit conducts associated with their respective second and third object tables. Furthermore, the arrangement reduces the amount of rotation of the first and second joints required to move the substrate table in the exposure and measuring areas and to transfer the substrate table from the exposure area to the measuring area or visa versa. This reduces stresses on the conduits and subsequently increases apparatus lifetime.

In the lithography apparatus of the first embodiment of the present invention, while one of the second or third object tables is in an exposure area in which the wafer held by the respective object table is irradiated, the other one of the second and third object tables is in a measuring area where the wafer is measured, loaded and offloaded.

Figure 3:
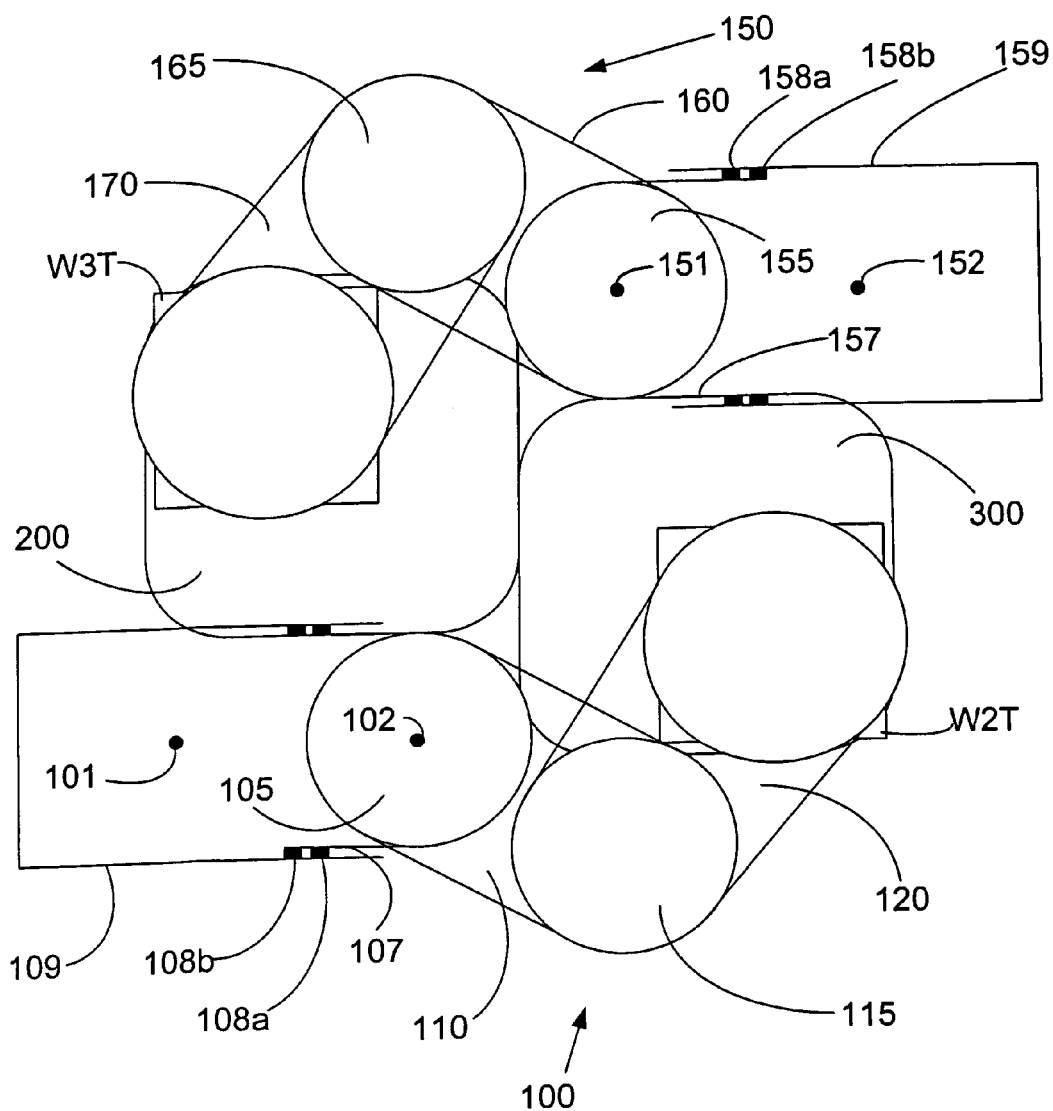
FIG. 3 is a schematic showing the position of first and second conduit conducts according to the first embodiment in normal operation.

FIG. 3 shows in plan the second object table W2T and the third object table W3T positioned in the measuring area 300 and exposure area 200, respectively. First conduit conduct 100 provides utilities to second object table W2T and second conduit conduct 150 provides utilities to the third object table W3T.

First and second conduit conducts 100, 150 are identical and comprise a first arm portion 110, 160 and a second arm portion 120, 170 which are rotatably connected at first joint 115, 165. The first arm portions of the first and second conduit conducts 100, 150 are rotatable relative to the exposure area 200 (first working zone), the measuring area 300 (second working zone) and the lithographic apparatus around second joints 105, 155. As shown in FIG. 3 when the second object table is in the measuring position, the second joint 105 of the first conduit conduct 100 rotates around a second position 102. In the second position the second object table is positionable within the measuring area 300. In contrast, when the third object table W3T is positioned within the exposure area 200, the second joint 155 of the second conduit conduct 150 is in a first position 151. The second position 102 of the first conduit conduct 100 is generally equidistant from the exposure area 200 and the measuring area 300 and the first position 151 of the second conduit conduct 150 is generally equidistant from the exposure area 200 and measuring area 300. The second joints 105, 155 are translatable from the first to second positions 101,102,151,152 and visa versa through translation joints which comprise translating arm portions 107,157 attached to second joints 105, 155 which slide in receiving arm portions 109, 159 to move the first joints from the first to second positions 101, 102, 151, 152. The sliding seal is maintained by differential vacuum seals 108a, 158a and air bearings 108b, 158b.

Figure 4:
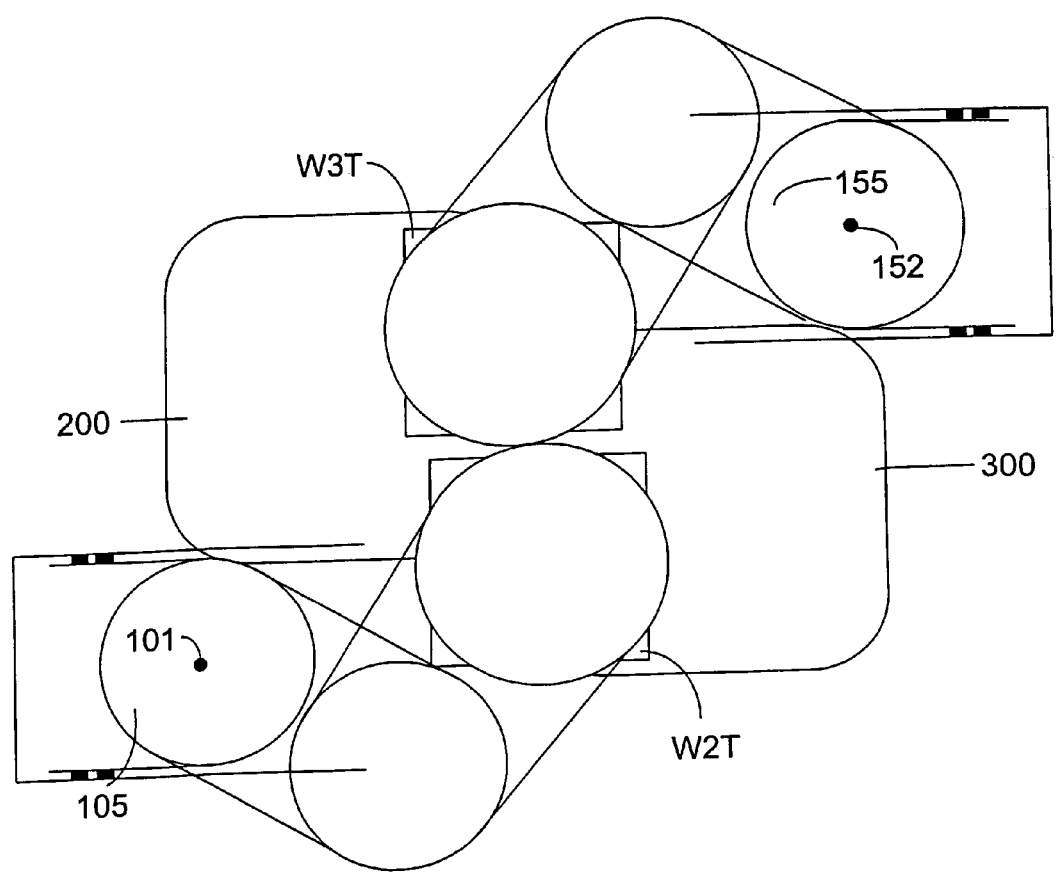
FIG. 4 is a schematic showing the positions of first and second conduit conducts according to the first embodiment during initial swap movements.
Figure 5:
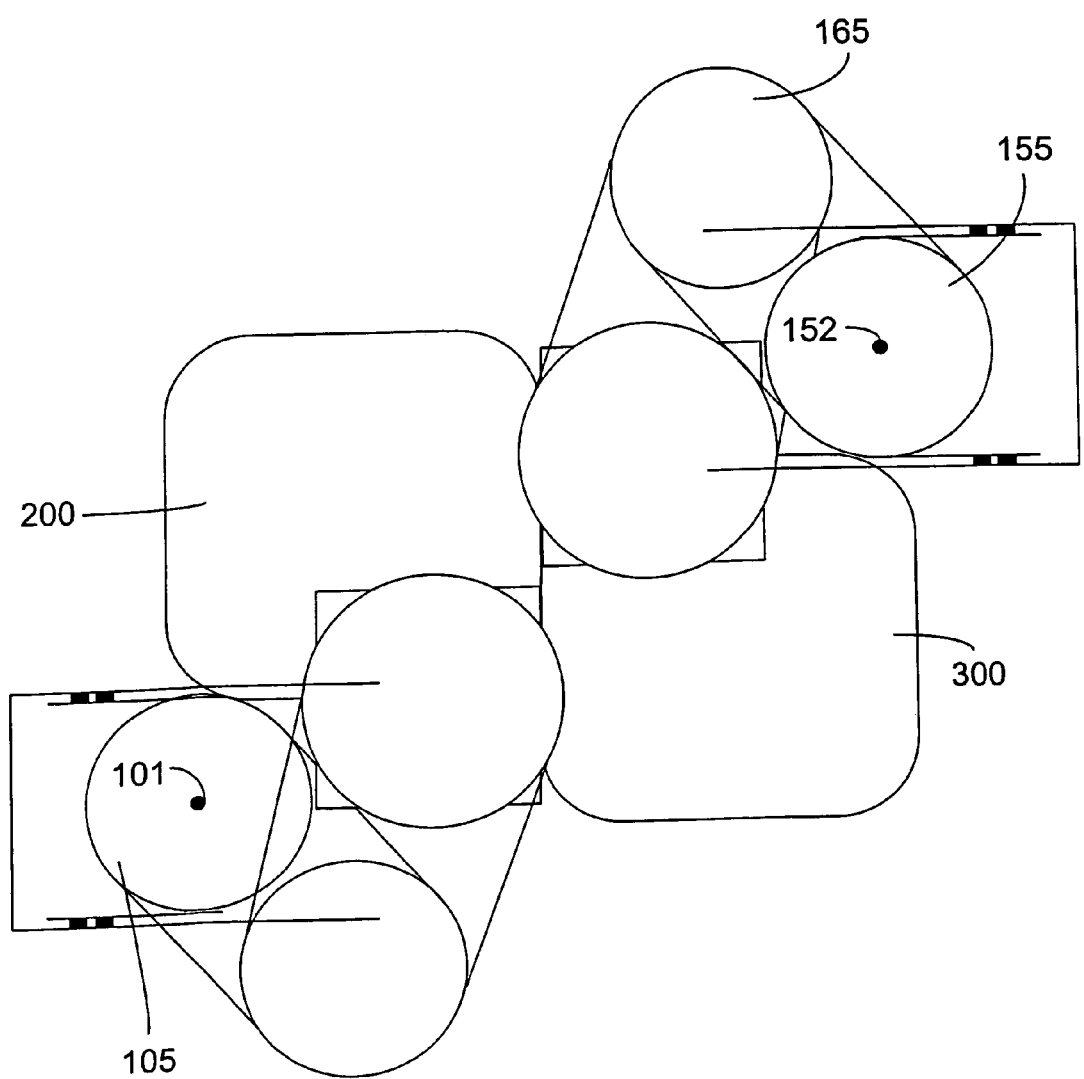
FIG. 5 is a schematic showing the positions of first and second conduit conducts according to the first embodiment during swap.

A "swap" operation, in which the second object table W2T moves from one of the exposure 200 and measuring 300 areas to the other area and the third object table W3T moves in the opposite direction, is depicted schematically in FIGS. 4 and 5. Although FIGS. 4 and 5 illustrate one combination of movements which result in so-called "swap", the sequence of movements could be in a different order.

As is shown in FIG. 4, if swap is to be initiated, the first step is the translation of the second joint 105, 155 of both first and second conduit conducts. In the case of the second object table W2T, the second joint 105 of the first conduit conduct 100 moves from its second position 102 to a first position 101 which is positioned closer to the exposure area 200 than to the measuring area 300. During this operation, the second object table W2T remains substantially within the measuring area 300 and it may move within that area. In the case of the third object table W3T, the second joint 155 of the second conduit conduct 150 moves from the first position 151 to a second position 152 while the third object table W3T remains substantially on the exposure area 200.

The next stage during swap is depicted in FIG. 5 in which the second and third object tables are moved towards the second joint 105, 155 of their respective conduit conducts 100, 150. In this position the second and third object tables are substantially between the exposure area 200 and measuring area 300.

Figure 6:
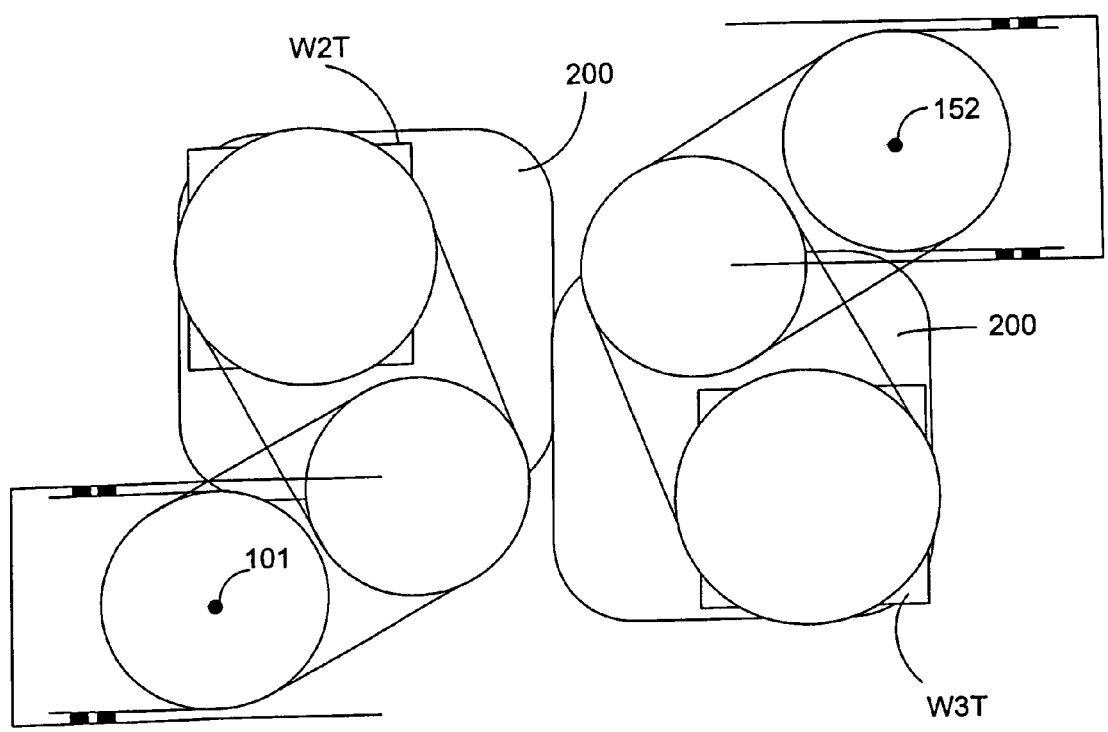
FIG. 6 is a schematic showing the positions of the first and second conduit conducts according to the first embodiment during normal operation.

Finally, as is shown in FIG. 6, for exposure of the wafer held on the second object table W2T, the second joint 105 of the first conduit conduct 100 is located at the first position 101 of the first conduit conduct 100. For measuring of the wafer on the third object table W3T, the second joint 155 of the second conduit conduct 150 is positioned at the second position 152 rather than the first position 151.

The joints 105, 115, 155, 165 of the conduit conducts 100, 150 have an angular range of motion of less than about 100° and in certain embodiments less than about 90°. This can be arranged by the correct positioning of the first 101, 151 and second 102, 152 positions and the sizes of the exposure and measuring areas 200, 300. Furthermore, by allowing translation of the second joint 105, 155, the size of the conduit conducts and the exposure and measurement areas can be minimized.

The second and third object tables may be rotatable relative to the second arm portion of their respective conduit conducts. Any number of arm portions, rotational joint and translatable joints may make up a conduit conduct. The precise arrangement will depend on the requirements and the number of degrees of freedom of the components with which they are associated. In the following embodiments variations are described as well as specific examples of the various components which make up the conduit conducts. It will be apparent to the skilled person that other variations not described here are also possible.

Embodiment 2

Figure 7:
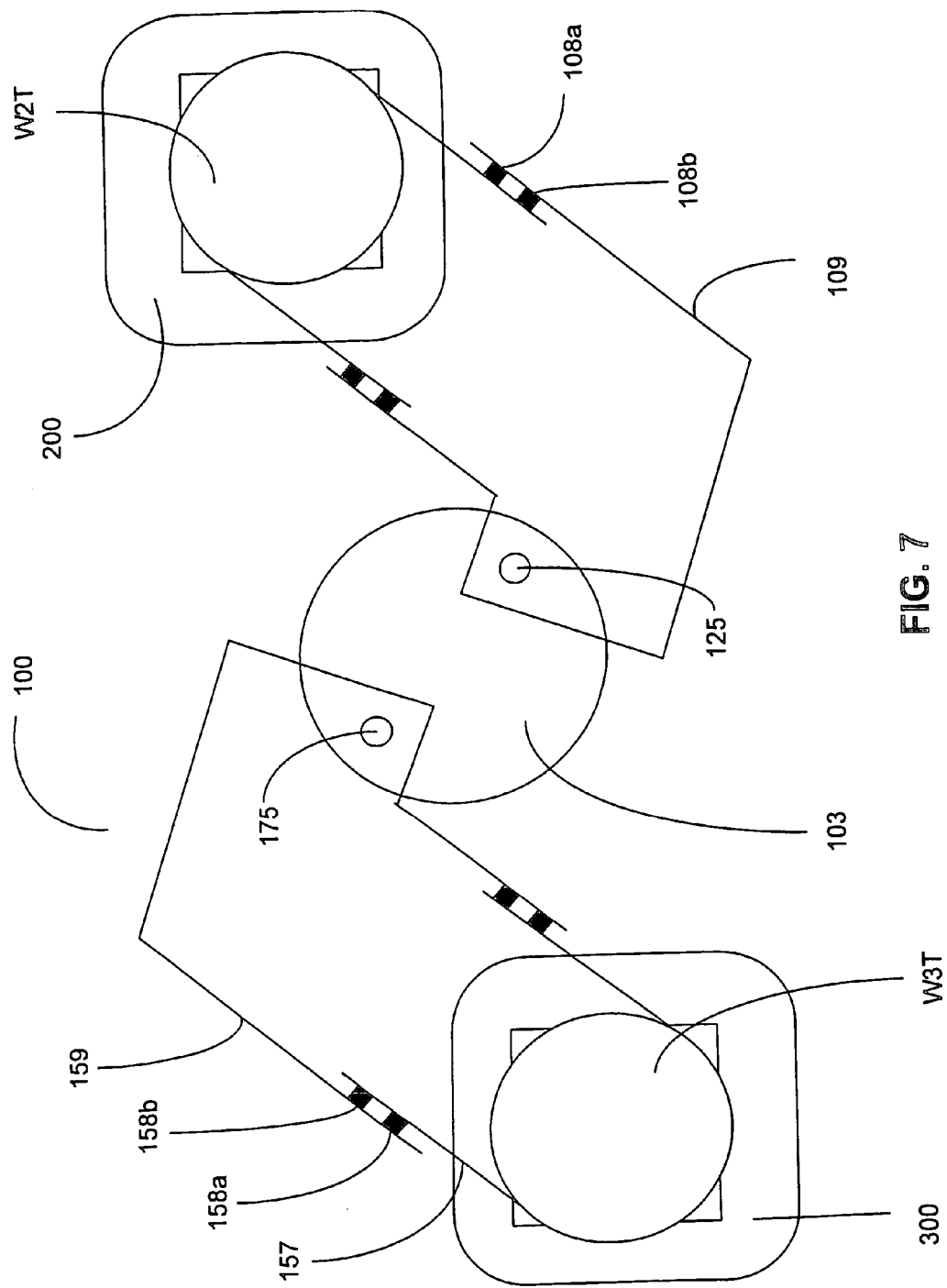
FIG. 7 is a schematic showing a conduit conduct of the second embodiment.

FIG. 7 shows a conduit conduct 100 according to a second embodiment which maybe is the same as the first embodiment save as described below. In the second embodiment the second and third object tables W2T, W3T are rotatably mounted to a main rotating joint 103. In order to perform swap, the main rotating joint 103 is rotated by 180° such that first and second object tables W2T, W3T swap positions illustrated in FIG. 7. Positioning in the exposure and measurement areas is accomplished through rotation of positioning joints 125, 175 to rotate the object tables W2T, W3T relative to main rotating joint 103 and through extension and retraction of translating arm portion 107, 157 out of and into receiving arm portion 109, 159. As in the first embodiment, the moving surfaces of the translating arm portions may be sealed using differential vacuum seals and air bearing assemblies 108, 158.

Embodiment 3

Figure 8:
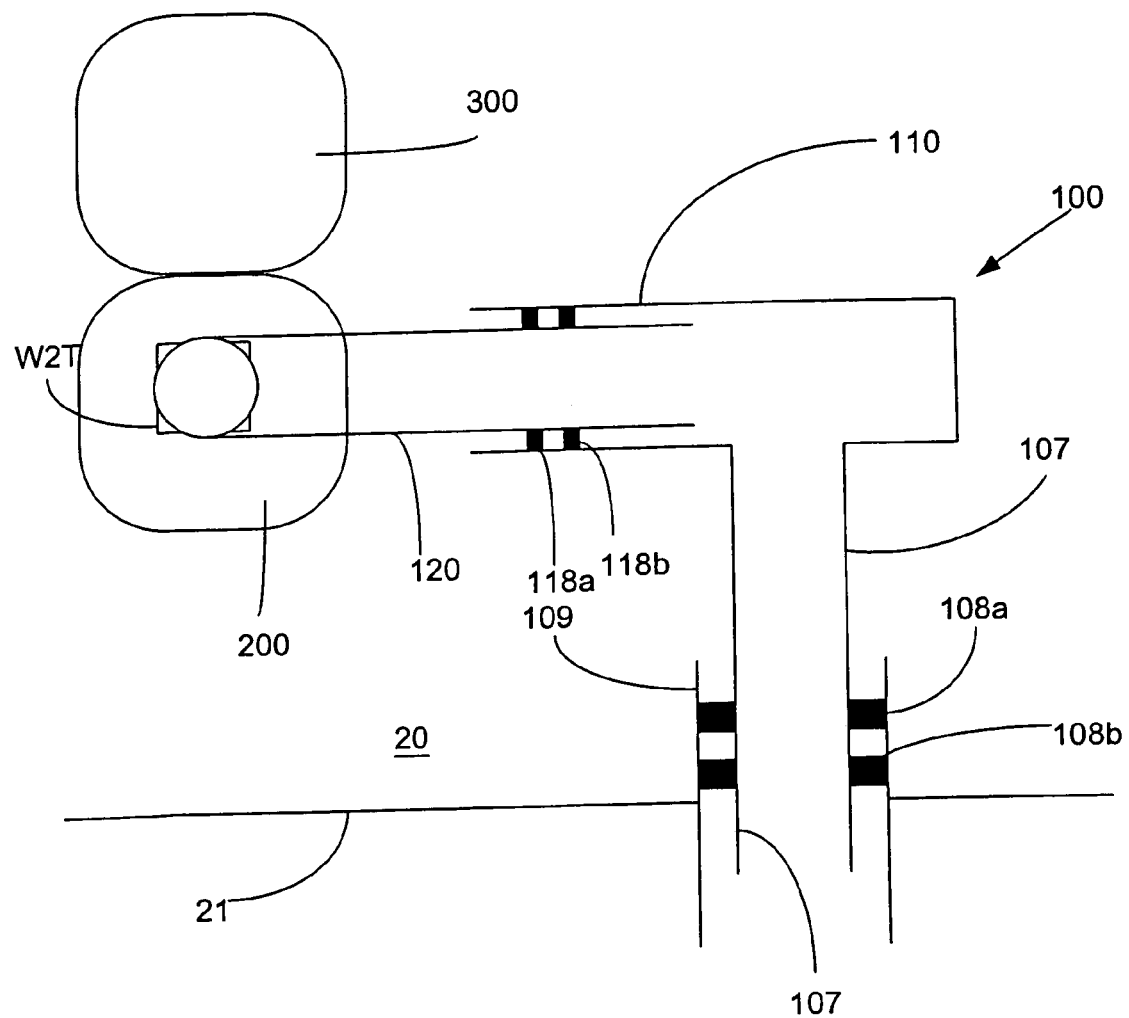
FIG. 8 is a schematic showing a conduit conduct of the third embodiment.

FIG. 8 shows a conduit conduct 100 according to a third embodiment which may be the same as the first embodiment save as described below. FIG. 8 only shows a single conduit conduct 100 and object table W2T. This embodiment of a conduit conduct can equally well be applied to the case where a third object table W3T is present and swap between the measurement area 300 and the exposure area 200 is necessary. In the third embodiment, the conduit conduct 100 has no rotational joints. For maneuverability the conduit conduct 100 is provided with two translatable joints allowing extension/retraction in substantially orthogonal directions. The conduit conduct 100 is the same as that in the first embodiment except that rotational first joint 115 is replaced by a translatable joint 118 and rotational second joint 105 is replaced by a fixed portion joining translating arm portion 107 at 90° to first arm portion 110. Translatable joint 118 is of the same structure as the translatable joint in the first embodiment and is sealed with a differential vacuum seal and air, or gas, bearing assembly 118.

Embodiment 4

Figure 9:
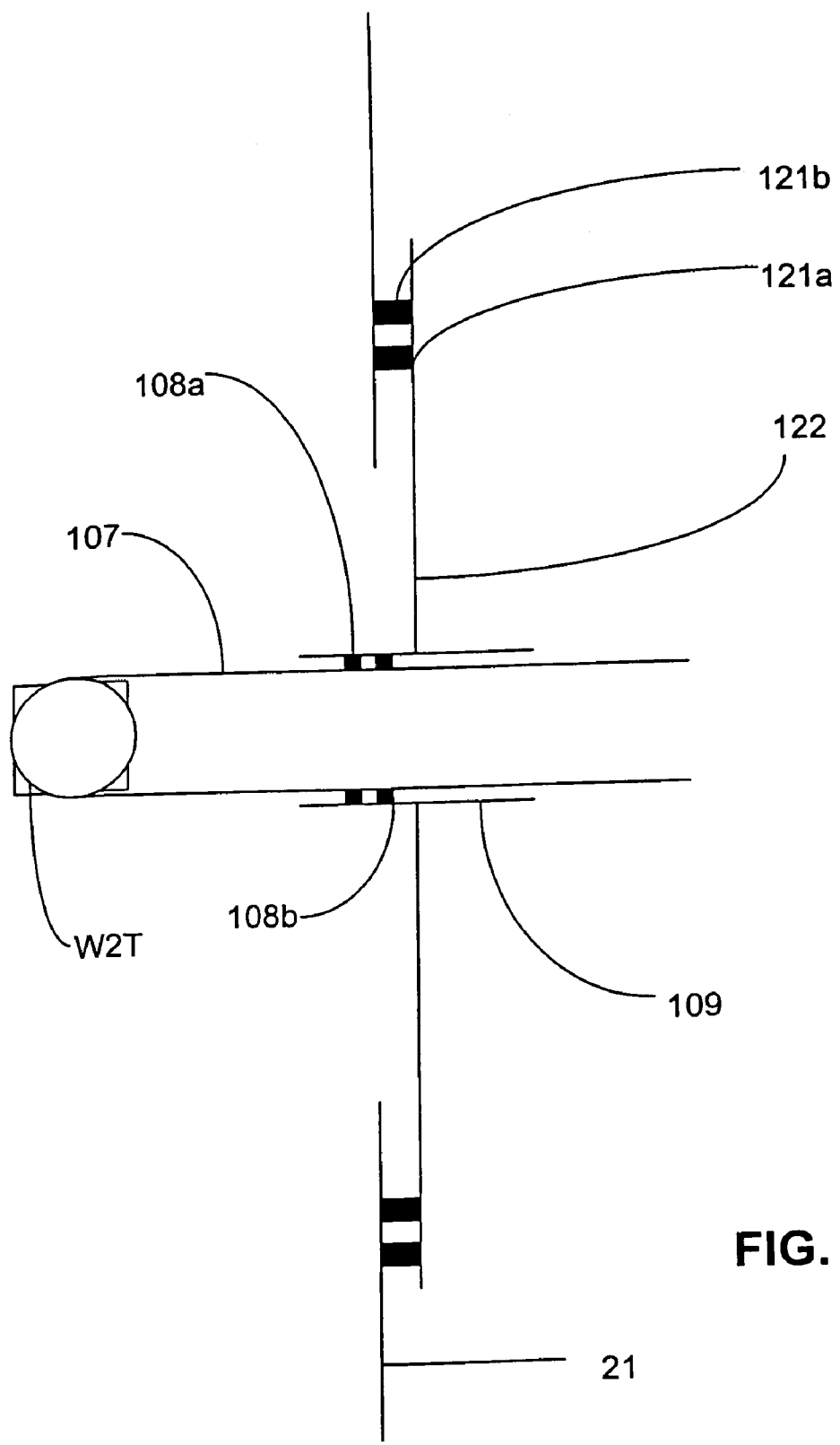
FIG. 9 is a schematic showing a conduit conduct of the fourth embodiment.

FIG. 9 shows a conduit conduct 100 according to a fourth embodiment which maybe the same as the first embodiment save as described below. In this embodiment the object table W2T is attached to the end of translating arm portion 107. Receiving arm portion 109 protrudes from a translatable plate 122 which is translatable (in a direction substantially orthogonal to the direction in which translating arm portion 107 is translatable) relative to the vacuum chamber side wall 21. Translatable plate 122 slides relative to vacuum side wall 21 on an air bearing and differential vacuum seal arrangement 121.

Embodiment 5

Figure 10A:
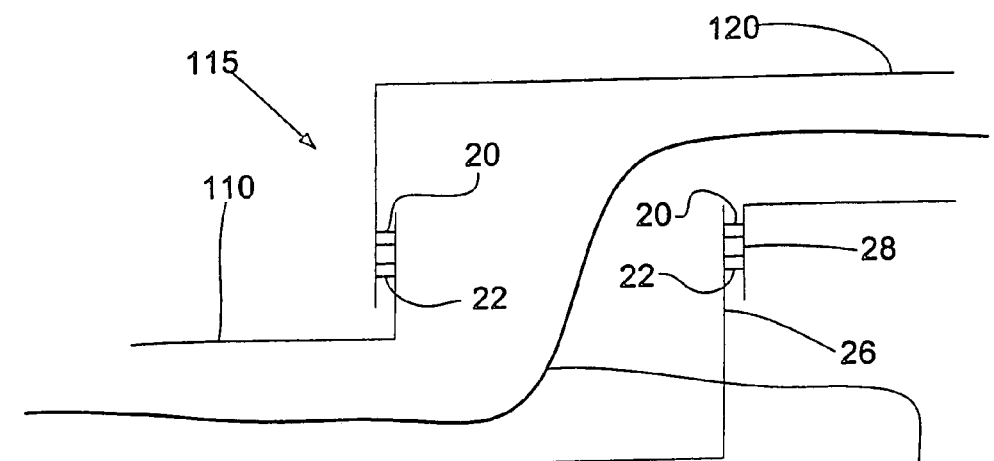
FIG. 10a is a schematic sectional view showing a joint of the fifth embodiment.

FIG. 10a shows in detail a joint 115 of the conduit conduct 100 of the fifth embodiment. Other bearing types are also possible and this description is given only as an example. In the schematic illustration, the joint 115 forms the hinge between the first arm portion 110 and the second arm portion 120. The joint may alternatively form the hinging mechanism between an arm portion 110, 120 and the vacuum chamber wall 21 or an object table W2T, W3T. A passageway through the joint 115, the first arm portion 110, and second arm portion 120 allows conduits 24 to pass through the conduit conduct 100. The joint 115 comprises a first member 26 with a cylindrical outer surface and a second member 28 with a cylindrical inner surface. The second member 28 co-operates with the first member 26 and is rotatable co-axially with and relative to the first member 26. An air bearing 20 and differential vacuum seal 22 is provided between opposing surfaces of first and second members 26, 28.

Figure 10B:
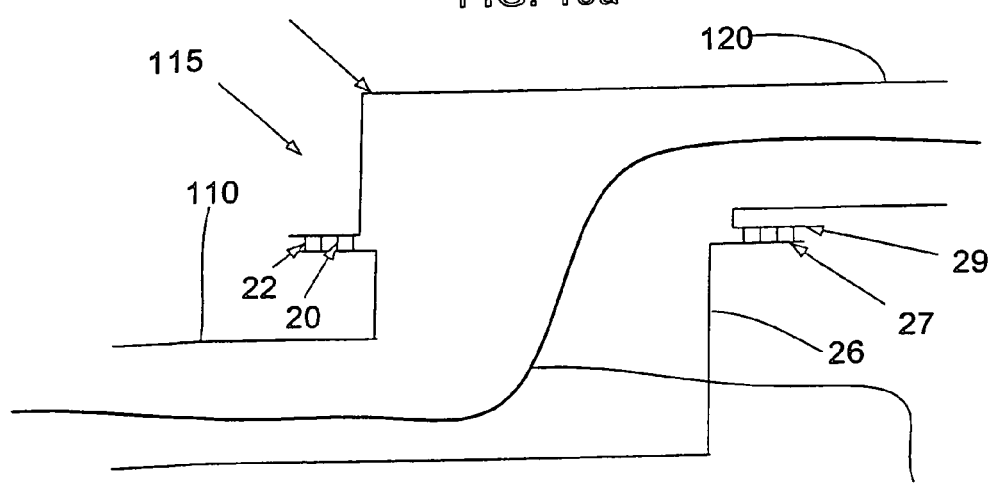
FIG. 10b is a variation on the joint of the fifth embodiment.

An alternative arrangement is shown in FIG. 10b in which the first and second members 26, 28 have flanges 27, 29 attached at their ends. The surfaces of the flanges oppose each other and an air bearing 20 and vacuum differential seal 22 are provided between the opposing surfaces.

The first and second members 26, 28 are formed as hollow open ended pipes such that conduits 24 may pass through the centre of the members. The first and second members 26, 28 are connected to the first and second arm portions 110, 120 such that conduits can pass from the first arm portion 110 through the joint 115 and into the second arm portion 120 with the only joining surfaces between the two arm portions being sealed by a vacuum differential seal. This allows for free rotation of arm portions 110 and 120 relative to each other while ensuring that the conduits 24 inside the conduit conducts 100 are not exposed to the vacuum. Differential vacuum seals comprise at least one passage exposed to a low pressure source. Optionally, a differential vacuum seal can comprise several passages each exposed to successively lower pressure sources. A differential vacuum seal is described in the seventh embodiment.

Embodiment 6

Figure 11:
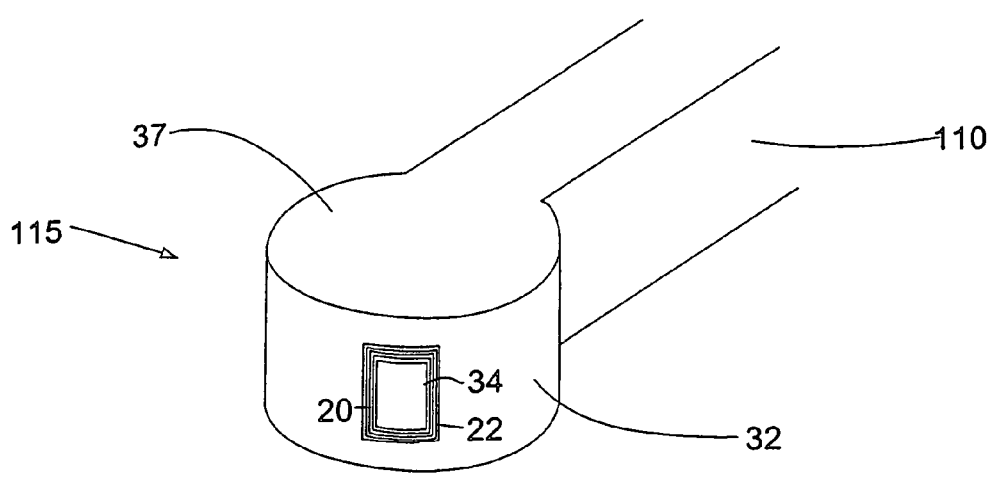
FIG. 11 is a schematic showing an inner member of a joint of a sixth embodiment.
Figure 12:
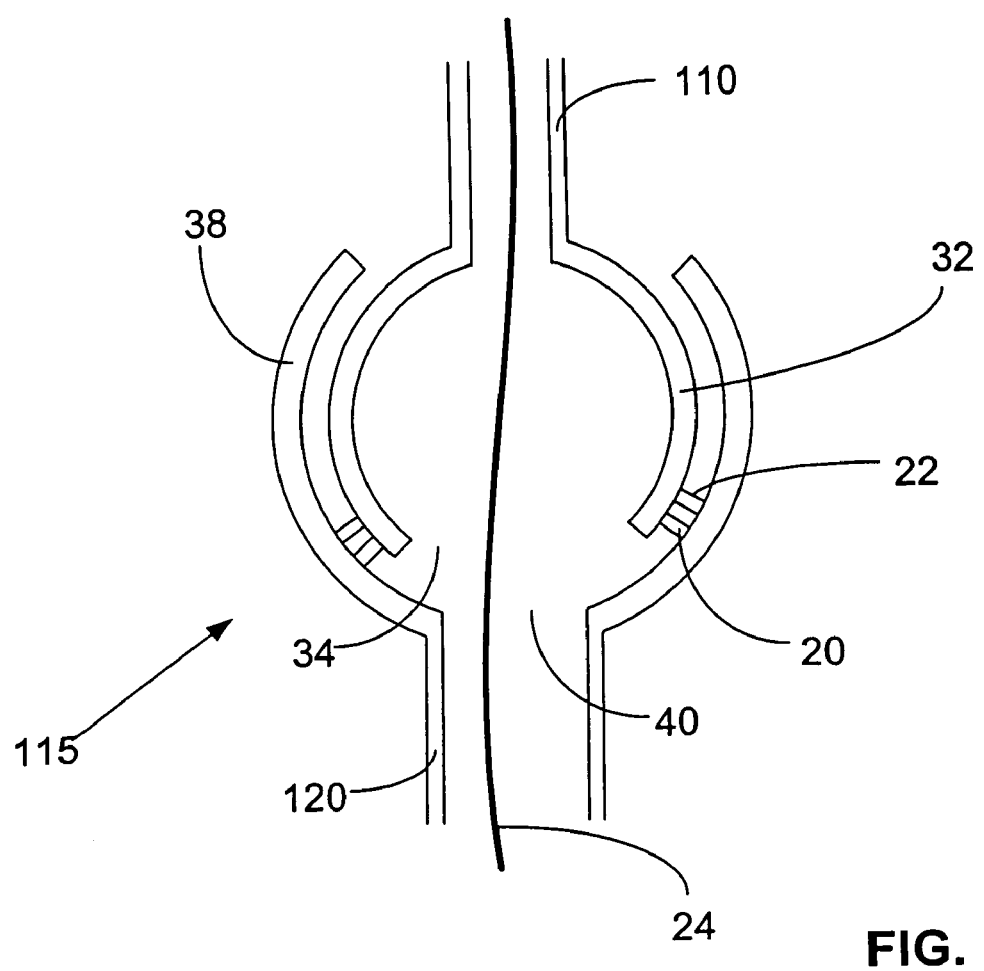
FIG. 12 is a schematic plan view showing the joint of the sixth embodiment.

FIGS. 11 and 12 show a joint 115 according to a sixth embodiment of the invention which is the same as the first embodiment save as described below. Joint 115 is provided such that first and second arm portions 110, 120 are substantially in the same plane. The joint may alternatively form the hinging mechanism between an arm portion 110, 120 and the vacuum chamber wall 21 or an object table W2T, W3T. In this embodiment, an inner member 32 with an at least partially cylindrical outer surface is provided at an end of a first hollow arm portion 110. As can be seen from FIG. 12, a second arm portion 120 is provided with an outer member 38 which has an at least partially cylindrical inner surface which co-operates with the outer surface of said inner member 32. The inner surface of the inner member 32 has a first opening 34 leading into said first arm portion 110 through which conduits 24 pass and the inner surface of the outer member 38 has a second opening 40 through which conduits 24 can pass into said second arm portion 120. An air bearing 20 and differential vacuum seal 22 are provided around openings 34 and 40 in between opposing surfaces of members 32 and 28. The inner member 32 is closed at the top and bottom of the cylindrical surface such that the inside of the cylinder is not exposed to the vacuum. The sizes of the first and second openings 34, 40 in the inner member are dimensioned such that at any angle of desired rotation the first opening 34 and second opening 40 align such that conduits 24 can pass through said first arm portion 110 into said second arm portion 120. Because this configuration allows first and second arm portions 110, 120 to be in substantially the same (horizontal) plane, the conduits 24 are only bent and not twisted relative to each other as the arm portions 110, 120 rotate about the joint 115. This is advantageous because the lifetime of the conduits 24 can be increased by reducing twisting and/or rubbing together.

Embodiment 7

Figure 13:
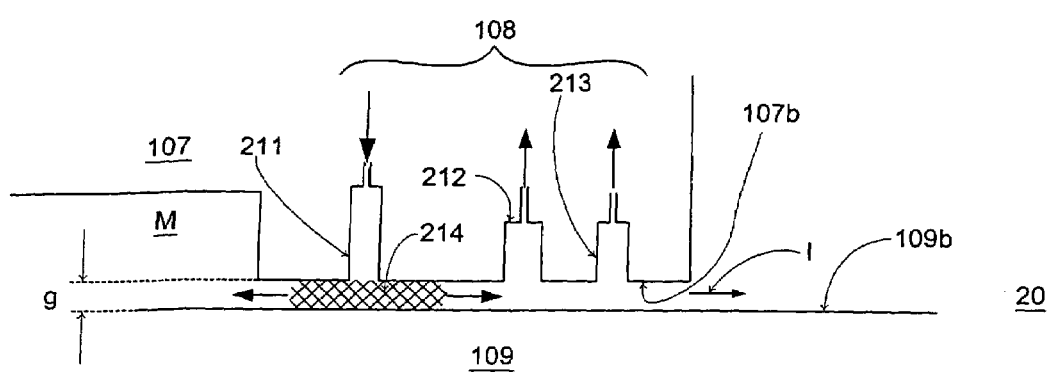
FIG. 13 is a cross-sectional view of a differential gas bearing according to a seventh embodiment of the invention.

An example of a gas bearing ("air bearing") and differential vacuum seal which can be used in the embodiments described above will now be described referring to FIG. 13. FIG. 13 is a cross-section through a differential gas-bearing 108, showing part of a supporting member, e.g. receiving translatable arm portion 109, and a supported member, e.g. translating arm portion 107. Gas bearing 108 holds the translating arm portion 107 off the receiving arm portion by a constant gap, g, of 5 µm, for example. For such a gap, the surface 109b of the receiving arm portion 109 in the vicinity of the bearing, and the surface 107b of the translating arm portion 107 over the area of travel of the bearing, must be finished to an RMS surface roughness of less than 0.8 µm, though they need not be flatter than 0.4 µm RMS surface roughness. This can readily be achieved with known mechanical polishing techniques. In some applications a gap in the range of from 5 µm to 10 µm may be appropriate and the surfaces need not be finished to such high tolerances. Clean air (or other gas, e.g. $N_2$) is supplied continually through gas feed 211 at a pressure of several atmospheres to generate a high pressure region 214. The supplied air will flow towards a compartment M and also the vacuum chamber 20, where its presence would, of course, be undesirable. An escape path to atmospheric pressure is provided via groove 212. To prevent further the air that forms the air bearing becoming an unacceptable leak into the vacuum chamber 20, it is pumped away via vacuum conduit 213. If desired, the escape path 212 may also be pumped. In this way, the residual leakage, 1, into the vacuum chamber 20 can be kept within acceptable levels.

Embodiment 8

Figure 14:
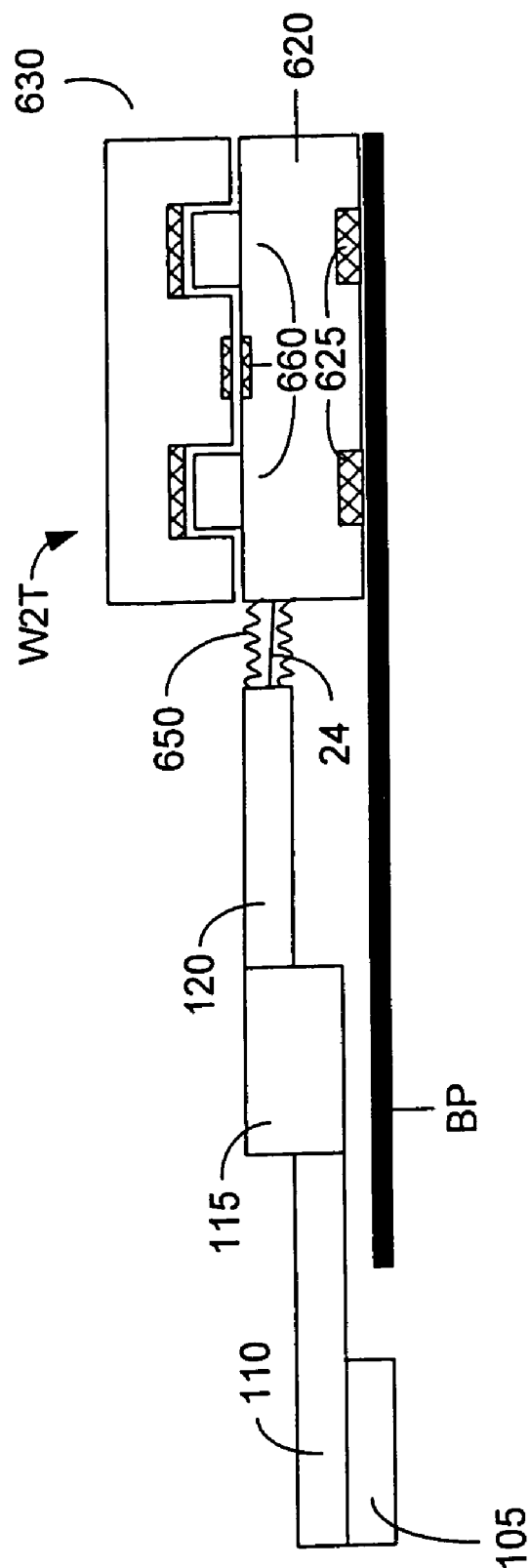
FIG. 14 is a cross-sectional view of the substrate table and forearm of the positioning means of an eighth embodiment of the lithographic projection apparatus according to the invention.

An eighth embodiment of the invention is shown schematically in FIG. 14. This embodiment may be the same as the first embodiment save as described below. Although only one conduit conduct and object table are shown, the same arrangement can be used for both second and third object tables with respective first and second conduit conducts of the present invention as well as the first object table. Like references are used where possible.

In the eighth embodiment, the object tables are connected to positioning means which are independent of the conduit conduct. The conduit conduct may or may not include, for example, torque motors in the second joint 105 and first joint 115. The second arm portion 120 of the conduit conduct is attached to the object table W2T with bellows 650 through which conduits 24 pass. In this way, utilities are provided from second joint 105 to object table W2T.

Object table W2T is connected to positioning means comprising a first or long stroke module 620 and a second or short stroke module 630. Long stroke module 620 has a first range of motion relative to a frame of reference and short stroke module 630 is supported by the long stroke module 620 and has a second range of motion, the second range of motion being smaller than the first range of motion.

The area over which long stroke module 620 can move is designated BP. In this embodiment the area is provided with a planar motor magnet array in base plate BP. Exposure area 200 and measuring area 300 in this embodiment as shown in FIG. 3 also have a planar motor magnet array and areas outside of the exposure and measuring areas, especially between the two areas, are also provided with a planar motor magnet array as necessary.

The positioning means for the object table in the eighth embodiment of the present invention comprises planar motor coils 625 in the long stroke module 620. Positioning of the short stroke module 630 on the long stroke module 620 is accomplished by use of Lorentz-force motors 660 with 6 degrees of freedom. The planar motor and Lorentz-force motors are only schematically depicted in FIG. 14.

Embodiment 9

Figure 15:
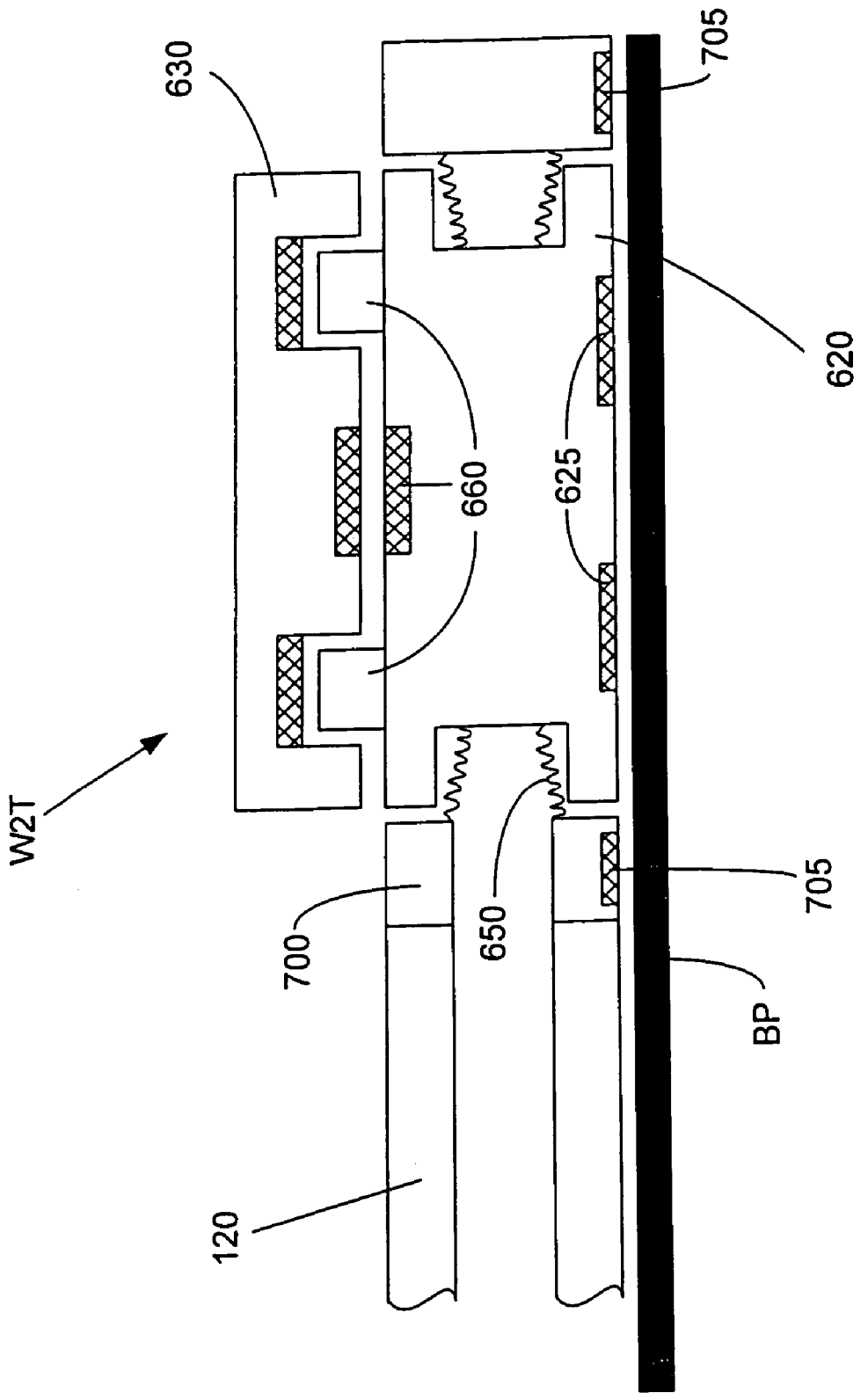
FIG. 15 is a cross-sectional view of the substrate table and forearm of the positioning means of a ninth embodiment of the lithographic projection apparatus according to the invention.

A ninth embodiment of the invention is shown schematically in FIG. 15. This embodiment may be the same as the first embodiment save as described below. In FIG. 15, only a part of the second arm portion of the conduit conduct is illustrated. A tray 700 for coarse positioning of the object table is attached to the end of the second arm portion 120 of the conduit conduct which is positionable through use of planar motor coils 705 and a planar motor magnetic array incorporated in base plate BP. Conduits are supplied to a first, long stroke module 620 of the positioning means connected to object table W2T, through bellows 650. The positioning means for the long stroke module in this embodiment of the present invention comprises planar motor coils 625. As in the eighth embodiment a short stroke module 630, positioned on top of the long stroke module, is positioned by Lorentz-force motors 660 with 6 degrees of freedom.

Embodiment 10

Figure 16:
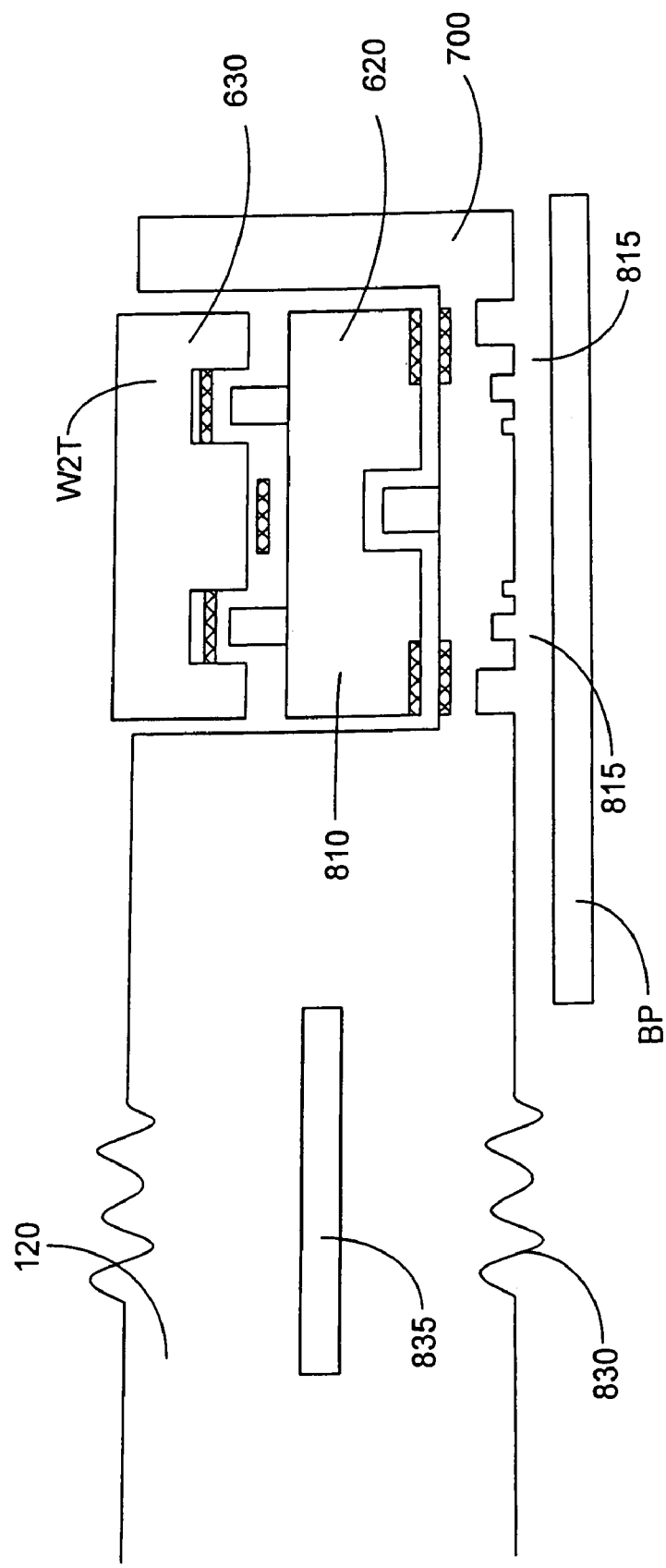
FIG. 16 is a cross-sectional view of the substrate table and forearm of the positioning means of a tenth embodiment of the lithographic projection apparatus according to the invention.

A tenth embodiment of the present invention is illustrated schematically in FIG. 16. This embodiment may be the same as the first embodiment save as described below. In this embodiment the position of a tray 700 which carries the object table is determined by the conduit conduct whose first and second joints are driven by torque motors, for example. The weight of the tray 700 is supported on surface BP by air bearings with differential vacuum seals 815. A bellows 830 and leaf spring 835 arrangement in the arm portion 120 of the conduit conduct near the tray 700 allows a small amount of relative movement between the conduit conduct and the tray. Major positional movements are carried out by the torque motors in the conduit conduct joints but medium sized movements are carried out by movement of first module 620 and minor movements are carried out by movement of second module 630. First module 620 is moved relative to tray 700 with the use of 6 degree of freedom medium stroke Lorentz-force actuators. Movement between the first module 620 and the second module 630 is also accomplished using a 6 degrees of freedom Lorentz-force actuator. Gravity compensators may be employed with Lorentz-force actuators to supply a force counteracting gravity for relieving the Lorentz-force motors from delivering such a force.

The invention is described above in relation to various embodiments; however it will be appreciated that the invention is not limited by the above description. In particular, the invention has been described above in relation to the wafer stage of a lithographic apparatus that is accommodated in a vacuum chamber. However, it will readily be appreciated that the present invention is equally applicable to mask tables.

Further, the swap mechanisms disclosed may also be employed in a non-vacuum environment where utilities are provided to the object tables such that those utilities need not be disconnected during swap. A vacuum seal and conventional rolling bearings may be provided at places where a differential vacuum seal and air or gas bearing are applied in the application. The construction of a vacuum seal and a conventional roller bearing is less complex as the differential seal and the airbearing construction because no air/gas supply evacuation is needed in the joints.

The invention claimed is:

1. An assembly arranged to communicate at least one utility to a component located in a vacuum chamber, comprising a conduit constructed to communicate said at least one utility to said component, said component being moveable in said vacuum chamber, a conduit shield substantially enclosing a space comprising the conduit and substantially separating said space from said vacuum chamber, said conduit shield being constructed and arranged to allow for movement of the component, wherein a vacuum generator is provided that is coupled to said space and which is constructed and arranged to provide a vacuum in said space comprising the conduit.

2. An assembly according to claim 1, wherein said conduit shield comprises a conduit conduct to guide and shield said at least one conduit.

3. An assembly according to claim 2, wherein said conduit conduct has at least two joints.

4. An assembly according to claim 3, wherein moving co-operating surfaces of said joints are furnished with vacuum seals.

5. An assembly according to claim 4, wherein said vacuum seals are vacuum differential seals.

6. An assembly according to claim 5, wherein said joints are further furnished with gas bearings.

7. An assembly according to claim 2, wherein said conduit conduct comprises a motor in each of said at least two joints.

8. An assembly according to claim 7, wherein said motor is a torque motor.

9. An assembly according to claim 2, wherein said conduit conduct comprises at least one hollow elongate arm portion.

10. An assembly according to claim 9, wherein said at least one hollow elongate arm portion is translatable along its elongate direction relative to another structure at a translation joint.

11. An assembly according to claim 9, wherein one end of said at least one hollow elongate arm portion is rotatable about a joint.

12. An assembly according to claim 11, wherein an end opposite said one end of said at least one hollow elongate arm portion is rotatable about a second joint.

13. An assembly according to claim 11, wherein said joint has an angular range of motion of less than about 100°.

14. An assembly according to claim 13, wherein said angular range of motion is less than about 90°.

15. An assembly according to claim 1, wherein said vacuum provided with said vacuum generator to the space comprising the at least one conduit has a higher pressure than the pressure of a vacuum provided to said vacuum chamber.

16. An assembly according to claim 1, wherein said component is an object table and said at least one conduit is constructed and arranged to communicate the utility to said object table.

17. An assembly arranged to communicate an utility to a component located in a first vacuum space in a vacuum chamber, said assembly comprising a conduit and a conduit shield separating the first vacuum from a second vacuum within which the conduit is disposed.

18. A lithographic projection apparatus, comprising:
a radiation system that provides a beam of radiation;
a first object table adapted to support a patterning structure, the patterning structure serving to pattern the beam of radiation according to a pattern;
a second object table for holding a substrate; and
an assembly according to claim 17 arranged to communicate a utility to one of the object tables or one of the components of the radiation system located in the first vacuum space in the vacuum chamber.

19. A method of providing a utility through a conduit to a component located in a vacuum chamber comprising the steps of providing a first vacuum to the vacuum chamber while shielding the first vacuum from said conduit with a conduit shield and providing a second vacuum in a space comprising the conduit and separated from the first vacuum by the conduit shield.

* * * * *